(12) United States Patent
Kakimoto et al.

(10) Patent No.: US 12,046,456 B2
(45) Date of Patent: Jul. 23, 2024

(54) INSPECTION METHOD OF PLASMA PROCESSING APPARATUS

(71) Applicant: Hitachi High-Tech Corporation, Tokyo (JP)

(72) Inventors: Kota Kakimoto, Tokyo (JP); Masahiro Nagatani, Tokyo (JP); Yusuke Takegawa, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 502 days.

(21) Appl. No.: 17/438,007

(22) PCT Filed: May 15, 2020

(86) PCT No.: PCT/JP2020/019391
§ 371 (c)(1),
(2) Date: Sep. 10, 2021

(87) PCT Pub. No.: WO2021/229787
PCT Pub. Date: Nov. 18, 2021

(65) Prior Publication Data
US 2022/0328288 A1    Oct. 13, 2022

(51) Int. Cl.
*H01J 37/32*    (2006.01)
*G01M 3/28*    (2006.01)
*H01L 21/3065*    (2006.01)

(52) U.S. Cl.
CPC ..... *H01J 37/32449* (2013.01); *G01M 3/2876* (2013.01); *H01L 21/3065* (2013.01); *H01J 2237/334* (2013.01)

(58) Field of Classification Search
CPC ............ H01J 37/32449; H01J 2237/334
See application file for complete search history.

(56) References Cited

U.S. PATENT DOCUMENTS 7,567,422 B2 * 7/2009 Kitsunai ............. H01L 21/6833
361/230
8,197,704 B2 * 6/2012 Hashimoto ......... H01J 37/3244
156/345.33
(Continued)

FOREIGN PATENT DOCUMENTS

JP    2003240669 A    8/2003
JP    2016046503 A    4/2016
(Continued)

OTHER PUBLICATIONS

Search Report mailed Jul. 28, 2020 in International Application No. PCT/JP2020/019391.

*Primary Examiner* — Eric S. McCall
(74) *Attorney, Agent, or Firm* — Miles & Stockbridge, P.C.

(57) ABSTRACT

A plasma processing apparatus in which each of a plurality of source gas supply paths includes a first valve, a second valve disposed on an upstream side of the first valve, a flow rate regulator disposed between the first valve and the second valve, and a connection unit between the source gas supply path and an inert gas supply path. For each of the source gas supply paths, leakage in the first valve is sequentially determined, in a first inspection step, using a flow rate of the inert gas passing through the flow rate regulator, and in a second inspection step of, supplying the inert gas and detecting the leakage of the first valve on the source gas supply path using a change amount of a pressure of the inert gas if it is not determined in the first inspection step that there is a leakage in the first valve.

5 Claims, 4 Drawing Sheets

(56) References Cited

U.S. PATENT DOCUMENTS

| | | |
|---|---|---|
| 2016/0217980 A1* | 7/2016 | Nakatani ............ H01L 21/3065 |
| 2017/0159180 A1 | 6/2017 | Sawachi et al. |
| 2018/0180509 A1 | 6/2018 | Sawachi et al. |
| 2018/0337103 A1 | 11/2018 | Omori et al. |
| 2018/0374726 A1 | 12/2018 | Miyoshi |

FOREIGN PATENT DOCUMENTS

| | | |
|---|---|---|
| JP | 2017032305 A | 2/2017 |
| JP | 2018195689 A | 12/2018 |
| JP | 2019009250 A | 1/2019 |

* cited by examiner

INSPECTION METHOD OF PLASMA PROCESSING APPARATUS

TECHNICAL FIELD

The present invention relates to an inspection method for inspecting a supply amount of a processing gas of a plasma processing apparatus that processes a substrate-shaped sample such as a semiconductor wafer disposed in a processing chamber in an inner portion of a vacuum vessel by a plasma formed using the processing gas supplied into the processing chamber, and particularly relates to a method for inspecting an amount of a processing gas, including a plurality of types of gases at a predetermined composition, that flows in an inner portion of a gas supply line connected to the processing chamber.

BACKGROUND ART

In the related art, in a step of manufacturing a semiconductor device, a dry etching apparatus is widely used in order to form a structure of a circuit of a device by performing desired processing on a semiconductor wafer such as silicon or a substrate-shaped sample such as an LCD substrate. The dry etching apparatus is typically a plasma processing apparatus that forms a plasma by exciting a process gas including a single highly reactive gas or a plurality of types of highly reactive gases introduced into a processing chamber, which is a chamber disposed in an inner portion of a vacuum vessel, by an electric field or a magnetic field supplied to the processing chamber, and performs processing such as etching using charged particles such as ions and highly reactive particles in the plasma.

In such a plasma processing apparatus, etching processing including a plurality of steps may be performed on the same wafer. In each of such a plurality of steps, processing gases of different types and compositions are supplied into the processing chamber, and wafer processing is performed under different process conditions. In order to perform such wafer processing (process), the plasma processing apparatus needs to have a gas supply line that is capable of switching and supplying different types of gases.

The gas supply line in the plasma processing apparatus includes: a plurality of pipes that are connected to and communicate with a plurality of gas supply sources in which different types of gases are stored and allow a plurality of types of gases to flow in an inner portion of the gas supply line; and a single common pipe that is connected to the plurality of pipes and in which gases from the inner portions of the plurality of pipes merges. Above each of the plurality of pipes, a flow rate regulator that adjusts a flow rate or a speed of a gas flowing in an inner portion of each of the pipes and a valve that opens and closes the inner portion of each of the pipes are provided. According to such a gas supply line, by selectively opening and closing the valves of the plurality of pipes, a gas selected from gases in the plurality of gas supply sources can be supplied to the processing chamber of the plasma processing apparatus with a predetermined composition.

In the plasma processing apparatus having such a gas supply line, when a leak occurs in the valve on the pipe, a processing gas having a composition different from an intended composition may be supplied into the processing chamber. As a result, the process processing is adversely affected. Therefore, in the plasma processing apparatus, presence or absence of the leak or an amount of the leak in the valve of the gas supply line is inspected for each predetermined period, and maintenance such as repair or replacement is performed on a valve on a pipe where it is detected that an amount of leak outside an allowable range has occurred.

As a technique in the related art relating to inspection of the leak in the valve of such a gas supply line, one disclosed in JP-A-2017-32305 (PTL 1) has been known. In this related art, a technique is disclosed for detecting and inspecting the leak in the valve by making the gas flow in a state in which a single valve or a plurality of valves to be inspected is closed by using the gas in the gas supply source connected to each gas supply line and detecting a pressure increase by a pressure gauge.

CITATION LIST

Patent Literature

PTL 1: JP-A-2017-32305

SUMMARY OF INVENTION

Technical Problem

However, in the above-described technique in the related art, the following points have not been sufficiently considered.

That is, when valves on a plurality of gas supply pipes of a gas supply line are inspected, leaked gases may be mixed during inspection if there is leakage in a plurality of valves. On the other hand, when presence or absence of the leak is individually inspected for each valve in a state in which other valves are closed, the above-described gas mixing problem does not occur. However, in a step of performing etching processing on a semiconductor wafer to manufacture a semiconductor device in recent years, it is common that a plurality of types of gases are mixed and supplied to a processing chamber as a processing gas, and the number of types of gases tends to increase. Therefore, if a plasma processing apparatus sequentially inspects each of the plurality of pipes of the gas supply line including pipes through which different types of gases flow, the time required for works of the inspection becomes enormous. Since an operation for manufacturing the semiconductor device of the plasma processing apparatus is stopped while such an inspection is being performed, a problem that an operation rate and a processing efficiency of the apparatus are lowered has not been taken into consideration in the above-described related art.

An object of the invention is to provide an inspection method for a plasma processing apparatus capable of improving operating rate and processing efficiency.

Solution to Problem

The above-described object is achieved by an inspection method for a plasma processing apparatus, the plasma processing apparatus including: a processing chamber in which a wafer is processed using a plasma that is formed by supply, into a processing chamber disposed in an inner portion of a vacuum vessel, a processing gas obtained by mixing a plurality of types of gases; and a processing gas supply path that has a plurality of source gas supply paths in which the plurality of types of gases flow in respective inner portions thereof and are supplied, and a merging path in which the plurality of source gas supply paths merge together as one flow path between the plurality of source gas supply paths and the processing chamber, in which each of the plurality of source gas supply paths includes: a first valve configured to open and close the source gas supply path; a second valve disposed on an upstream side of the first valve; a flow rate regulator disposed between the first valve and the second valve and configured to regulate a flow rate of the source gas flowing in the inner portion of the source gas supply path; and a connection unit between the source gas supply path and an inert gas supply path in which an inert gas is supplied to the inner portion connected at a position between the second valve and the flow rate regulator. The inspection method for a plasma processing apparatus includes: a first inspection step of, for each of the plurality of source gas supply paths, sequentially determining presence or absence of a leakage in the first valve on the source gas supply path using a flow rate of the inert gas passing through the flow rate regulator on the source gas supply path in a state in which the first valve is closed in each of the plurality of source gas supplying paths and the inert gas is supplied from the inert gas supplying path; and a second inspection step of, for each of the plurality of source gas supply paths, supplying the inert gas from the inert gas supply path connected to the source gas supplying path in a state in which the first and second valves are closed and detecting the leakage of the first valve on the source gas supply path using a change amount of a pressure of the inert gas supplied to the inert gas supply path if it is not determined in the first inspection step that there is a leakage in the first valve.

Advantageous Effect

According to the invention, leaks in valves provided in a plurality of pipes connected to a plurality of gas supply sources can be detected with high accuracy in a short time while preventing mixing of gases, and time required for maintenance and inspection of a plasma processing apparatus is shortened, thereby improving an operation rate and a processing efficiency.

DESCRIPTION OF EMBODIMENTS

Hereinafter, an embodiment of the invention will be described with reference to the drawings.

In the present embodiment, a plasma processing apparatus includes a processing chamber in an inner portion of a vacuum vessel to which an exhaust apparatus is coupled, an inert gas supply line that supplies a purge inert gas for replacing a gas in an inner portion of the processing chamber, process gas supply lines that supply a plurality of process gases into the process chamber, and a control unit that controls operations of each of valves and a flow rate regulator disposed in each of the gas supply lines, and leaks in a plurality of process gas valves are simultaneously inspected using an inert gas. In particular, when a leakage of the gas due to the leak in the valve is detected by a pressure gauge in the processing chamber during a simultaneous inspection, a flow rate value of the gas flowing through the flow rate regulator of each process gas supply line is confirmed, and a valve having the leak is specified. Further, if the flow rate of the gas is not confirmed in the flow rate regulator, each process gas supply line is pressurized and filled with the inert gas, and a pressure value of a pressure gauge disposed in the inert gas supply line is confirmed for each process gas supply line to specify a valve having the leak.

First Embodiment

An embodiment of the invention will be described below with reference to the drawings. A plasma processing apparatus of the present embodiment is a plasma etching apparatus that supplies process gases into a processing chamber disposed in an inner portion of a vacuum vessel, and performs an etching processing on a substrate-shaped sample such as a semiconductor wafer disposed in the processing chamber using a plasma formed by exciting the process gases using an electric field or a magnetic field introduced into the processing chamber.

Figure 1:
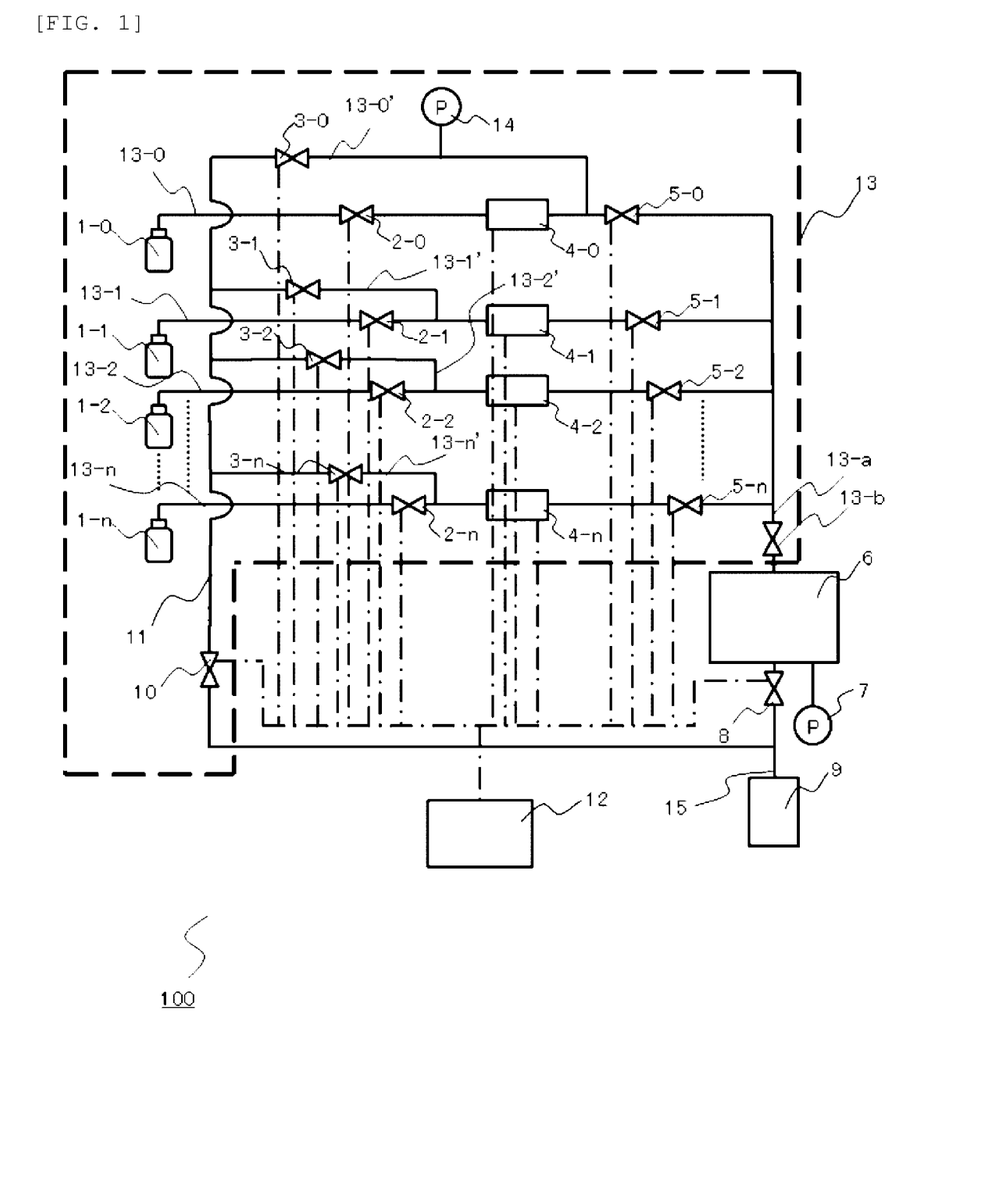
FIG. 1 is a diagram schematically showing an outline of a configuration of a plasma processing apparatus according to an embodiment of the invention.

FIG. 1 is a diagram schematically showing an outline of a configuration of the plasma processing apparatus according to the embodiment of the invention. This figure schematically shows, regarding the plasma processing apparatus according to the embodiment of the invention, a mode of coupling between a gas supply line including pipes that supply an inert gas and the process gases and an exhaust system including the processing chamber in the inner portion of the vacuum vessel and an exhaust pump that exhausts the inside of the processing chamber.

In this figure, a plasma processing apparatus 100 includes the vacuum vessel and a processing chamber 6 disposed in the inner portion of the vacuum vessel, and an exhaust pump 9, having a vacuum pump such as a turbo molecular pump and a roughing vacuum rotary pump, that is connected to a lower portion of the vacuum vessel, communicates with the processing chamber 6, and exhausts the inner portion of the processing chamber 6 to depressurize the inner side to a desired vacuum state. The plasma processing apparatus 100 is coupled to a gas supply line 13 that supplies a purge gas and the process gases into the processing chamber 6.

The exhaust pump 9 exhausts the gases and particles in the processing chamber 6 to depressurize the inner portion of the processing chamber 6, and sets a pressure in a predetermined pressure range using a pressure gauge 7 in the processing chamber 6. In the plasma processing apparatus 100 of the present embodiment, an inlet of the exhaust pump 9 and an exhaust port (not shown) disposed in the processing chamber 6 are connected to and communicate with each other by an exhaust line 15, and on the exhaust line 15 between the inlet and the exhaust port, an exhaust regulating valve 8 that regulates a flow rate or a speed of the gases and the particles from the processing chamber 6 flowing in the exhaust line by increasing or decreasing a cross-sectional area across a flow direction in a pipe of the exhaust line 15 is provided.

The gas supply line 13 has a plurality of source gas lines including pipes through which different types of gases flow, and a merged gas supply line 13-a that is one pipe connected to and communicating with pipes of these source gas lines and in which gases from the source gas lines merge and a mixed gas flows in a predetermined ratio. The source gas lines of the present embodiment include an inert gas supply line 13-0 and first to n-th process gas supply lines 13-1 to **13-*n***.

The inert gas supply line 13-0 has an inert gas supply source 1-0 and an inert gas shutoff valve 2-0 that regulates flow or shutoff of the inert gas from the inert gas supply source 1-0 in the inert gas supply line 13-0 by an operation of opening or closing. A flow rate regulator 4-0 that has a function of detecting a flow rate or a speed of a gas flowing in the inert gas supply line 13-0 and regulates the flow rate or the speed of the gas flowing in the inert gas supply line 13-0 is provided at a position on a downstream side of the inert gas shutoff valve 2-0 in a flow direction of the inert gas. Further, an inert gas introduction valve 5-0 that regulates introduction or shutoff of the inert gas into the merged gas supply line **13-*a* by the operation of opening or closing is provided at a position on a downstream side of the flow rate regulator 4-0**, and these members are sequentially coupled by the pipe in the above order.

In the present embodiment, a bypass line 11 communicating with each line of the source gas lines is provided so as to introduce the gas flowing through each line of the source gas lines into a portion on the exhaust line 15 between the inlet of the exhaust pump 9 and the exhaust regulating valve 8. For example, in the inert gas supply line 13-0, the other end of an inert gas exhaust line 13-0' is connected to the bypass line 11, and one end of the inert gas exhaust line 13-0' is connected to and communicates with a portion on the inert gas supply line 13-0 between the flow rate regulator 4-0 and the inert gas introduction valve 5-0. Further, an inert gas exhaust purge valve 3-0 is provided on a bypass line 11 side on the inert gas exhaust line 13-0', and a pressure gauge 14 is provided on an inert gas supply line 13-0 side on the inert gas exhaust line 13-0'.

Similarly to the inert gas supply line 13-0, the first to n-th process gas supply lines 13-1 to **13-*n* of the gas supply line 13 of the present embodiment include a first process gas supply source 1-1 to an n-th process gas supply source 1-*n*, a first process gas shutoff valve 2-1 to an n-th process gas shutoff valve 2-*n*, and first to n-th flow rate regulators 4-1 to 4-*n*. A first process gas introduction valve 5-1 to an n-th process gas introduction valve 5-*n* that regulate flow and shutoff of gases in inner portions of the process gas supply lines 13-1 to 13-*n* by operations of opening or closing are provided between the flow rate regulators 4-1 to 4-*n* on the process gas supply lines 13-1 to 13-*n* and connection positions between the process gas supply lines and the merged gas supply line 13-*a***, respectively.

Process gas exhaust lines 13-1' to **13-*n*' communicating with the bypass line are connected to the process gas supply lines 13-1 to 13-*n*, respectively. That is, the process gas exhaust lines 13-1' to 13-*n*' are disposed by being connected to portions between the first to n-th process gas shutoff valves 2-1 to 2-*n* and the flow rate regulators 4-1 to 4-*n* on the first to n-th process gas supply lines 13-1 to 13-*n* and positions on the bypass line 11 between the inert gas exhaust purge valve 3-0 and the exhaust valve 10, and communicate with these portions, respectively. As described above, an end portion of the bypass line 11 is connected to the inert gas exhaust line 13-0', and an inert gas flowing from a connection unit between the inert gas exhaust line 13-0' and the bypass line 11 along a pipe branched from between the flow rate regulator 4-0 and the inert gas introduction valve 5-0 is introduced into each of the process gas exhaust lines 13-1' to 13-*n*'**.

Further, a first process gas exhaust purge valve 3-1 to an n-th process gas exhaust purge valve **3-*n* that open or close inner portions of the process gas exhaust lines 13-1' to 13-*n*' are disposed on the inner portions of the process gas exhaust lines 13-1' to 13-*n*' that connect the bypass line 11 to each process gas supply line. On the other hand, a location on the bypass line 11 and closer to the exhaust line 15 than any of locations where process gas exhaust line 13-1' to 13-*n*' and the bypass line 11 are connected, that is, between a connection position between the bypass line 11 and the exhaust line 15 and connection portions between all the above-described process gas exhaust lines and the bypass line 11, the exhaust valve 10 that regulates flow or shutoff of gases in the bypass line 11** by the operation of opening or closing is provided.

The inert gas from the inert gas supply source 1-0 flows through the inert gas supply line 13-0 at a flow rate or a speed adjusted by the flow rate regulator 4-0 in a state in which the inert gas shutoff valve 2-0 and the inert gas introduction valve 5-0 are opened, and is introduced into a merged gas supply line **13-*a*. In a state in which a merged gas introduction valve 13-*b* disposed on the merged gas supply line 13-*a* is opened, the gas in the merged gas supply line 13-*a* is introduced into the processing chamber 6. On the other hand, in a state in which the inert gas exhaust purge valve 3-0 on the inert gas exhaust line 13-0' is opened, at least a part of the gas in the inert gas supply line 13-0 is introduced into the bypass line 11 through the inert gas exhaust line 13-0', flows in the bypass line 11, is introduced into the exhaust line 15 in a state in which the exhaust valve 10 is opened, and is discharged by an operation of the exhaust pump 9**.

Similarly, a process gas from a process gas supply source **1-*k* (k is any one of 1 to n) flows through an inert gas supply line 13-*k* at a flow rate or a speed adjusted to a predetermined value by a flow rate regulator 4-*k* and is introduced into the merged gas supply line 13-*a* in a state in which both a process gas shutoff valve 2-*k* and a process gas introduction valve 5-*k* are released. The process gas introduced into the merged gas supply line 13-*a* is mixed and becomes a mixed gas having a predetermined composition or ratio when the inert gas is also introduced from a plurality of process gas supply lines or the inert gas supply line 13-0, and is introduced into the processing chamber 6 as a processing gas in a state in which the merged gas introduction valve 13-*b* is opened. On the other hand, in a state in which a process gas exhaust purge valve 3-*k* on a process gas exhaust line 13-*k*' is opened, at least a part of a gas in the corresponding process gas supply line 13-*k* is introduced into the bypass line 11 through the process gas exhaust line 13-*k*', flows in the bypass line 11, is introduced into the exhaust line 15 in the state in which the exhaust valve 10 is opened, and is discharged by the operation of the exhaust pump 9**.

On the other hand, the process gas exhaust line **13-*k*' connected to the bypass line 11 communicates with the inert gas exhaust line 13-0' connected to the bypass line 11. In the gas supply line 13 having such a configuration, the inert gas from the inert gas supply line 13-0 can be introduced into the first to n-th process gas supply lines 13-1 to 13-*n* for exhausting or purging of the inner portions of the first to n-th process gas supply lines 13-1 to 13-*n***.

End portions of the inert gas supply line and the first to n-th process gas supply lines on the processing chamber 6 side merge between these end portions and the processing chamber 6 to form one merged gas supply line **13-*a*. On the merged gas supply line 13-*a*, which has a pipe that couples merging units of the process gas supply lines and the processing chamber 6 from the merging units of the process gas supply lines to the processing chamber 6, the merged gas introduction valve 13-*b* that controls flow and shutoff of the gas in an inner portion of the merged gas supply line 13-*a* by an operation of opening or shielding is disposed. In the above-described embodiment, one merged gas supply line 13-*a* is coupled to the processing chamber 6. By the operations of the valves or the flow rate regulators disposed on the process gas supply lines, a plurality of gases of different types or compositions passing in these lines are merged and supplied into the processing chamber 6 as a gas of one type or composition, but a configuration may be provided in which at least one of the plurality of process gas supply lines is connected to the processing chamber 6, and a gas flowing in this line is introduced into the processing chamber 6** alone.

The valves or the flow rate regulators disposed on the source gas lines in the gas supply line 13 are communicably connected to a control unit 12, and operations of the valves or the flow rate regulators are regulated according to an instruction signal from the control unit 12. The control unit 12 includes an operation unit such as a CPU of a semiconductor device, and a storage device such as a CD-ROM that performs storage using RAM, ROM, a hard disk, or a removable storage medium. The control unit 12 further includes a communication interface connected to a wired or wireless communication unit to allow communication between the valve and the flow rate regulator, and a wired or wireless communication line connected to the operation unit, the storage device, and the interface to allow communication therebetween.

In a typical operation that the plasma processing apparatus 100 of the present embodiment processes a sample to be processed to manufacture the semiconductor device, on an outer side wall of a vacuum vessel having a cylindrical shape, a substrate-shaped sample such as the semiconductor wafer to be processed is placed and held on an arm of a carrying device such as a robot arm (not shown), carried in a depressurized space inside another vacuum vessels (not shown), and then carried into the processing chamber 6 in the inner portion of the vacuum vessel from a carrying chamber that is a decompressed space for carrying. The sample carried through a gate, which is a passage formed in the side wall of the vacuum vessel, is transferred to a sample stage or an electrode (not shown) in the inner portion of the processing chamber 6, at a predetermined position such as an upper surface of the sample stage or the electrode, and held by electrostatic adsorption or the like. After the carrying apparatus exits the processing chamber 6 through the gate, the gate is closed by a gate valve (not shown) to seal the inner portion of the processing chamber 6.

The processing gas is introduced into the processing chamber 6 from the gas supply line 13, the electric field or the magnetic field is supplied into the processing chamber 6 in a state in which the processing gas is maintained at a pressure value within a range suitable for a predetermined processing, the processing gas is excited, ionization and separation occurs and the plasma is formed, and processing of a film layer to be processed in a film structure including a mask layer formed in advance on an upper surface of the sample and the film layer to be processed below the mask layer is started. In this case, a high frequency power is supplied to the sample stage or the electrode, a bias potential corresponding to a potential of the plasma is formed above the upper surface of the sample, charged particles such as ions in the plasma are attracted to a surface of the sample and collide with each other, and etching processing in a direction of incidence of the charged particles in the film layer to be processed is promoted.

When the completion of the processing is detected, a purge gas such as the inert gas is introduced into the processing chamber 6, and a processing gas remaining in the inner portion of the processing chamber 6 and particles of products formed during the processing are replaced by the inflow purge gas and are discharged to the outside of the processing chamber 6 through the exhaust pump 9. Thereafter, after the electrostatic adsorption of the sample is released, the sample is transferred to the carrying apparatus that has entered the processing chamber 6, and is carried into the carrying chamber of the other vacuum vessel outside the processing chamber 6. If an unprocessed sample to be processed in the processing chamber 6 is present in a standby state, the unprocessed sample is carried back into the inner portion of the processing chamber 6, and if the unprocessed sample is not in the standby state, the gate valve is closed to seal the processing chamber 6 again, and the operation of processing the sample of the plasma processing apparatus 100 to manufacture the semiconductor device is stopped.

If the control unit 12 detects that the above-described operation of the processing by the plasma processing apparatus 100 is performed for a predetermined number of samples or a cumulative time, the control unit 12 stops the operation for processing the sample of the plasma processing device to manufacture the semiconductor device based on a software algorithm stored in the storage apparatus, and causes the apparatus to perform an operation (in a maintenance mode) for maintenance and inspection of the apparatus. In such a maintenance and inspection, the inside of the processing chamber 6 is opened to an atmosphere with a pressure equal to or close to an atmospheric pressure, and members disposed in the inner portion of the process chamber 6 are cleaned or replaced.

In this case, in the plasma processing apparatus 100, according to an instruction signal from the control unit 12, first, in a state in which the inert gas shutoff valve 2-0 and the inert gas introduction valve 5-0 are opened, the inert gas from the inert gas supply source 1-0 is introduced into the inert gas supply line 13-0 and then introduced into the processing chamber 6 through the merged gas supply line **13-*a* in which the merged gas introduction valve 13-*b* is opened. The pressure of the inner portion of the process chamber 6 is increased from a depressurize state, which is a predetermined vacuum state suitable for the processing, to the atmospheric pressure or to a pressure approximate to the atmospheric pressure. In the present embodiment, in this case, the exhaust regulating valve 8 is closed and the inner portion of the processing chamber 6** is sealed.

In the present embodiment, the maintenance and inspection of the gas supply line 13 are also performed during such a maintenance operation. In this case, in a state in which the first process gas shutoff valve 2-1 to the n-th process gas shutoff valve **2-*n* are closed, and the first process gas exhaust purge valve 3-1 to the n-th process gas exhaust purge valve 3-*n* are open, the gas line exhaust valve 10 is opened to exhaust process gases remaining in the pipes of the process gas supply lines 13-1 to 13-*n* by the operation of the exhaust pump 9 through the bypass line 11. In a state in which the inert gas exhaust purge valve 3-0 and the first process gas exhaust purge valve 3-1 to the n-th process gas exhaust purge valve 3-*n* are open, the inert gas is supplied to each of the process gas supply lines 13-1 to 13-*n* via the inert gas exhaust line 13-0'**, the process gas remaining in each of the process gas supply lines from which the remaining gas is exhausted including the flow rate regulators is pushed out to the merged gas supply line 13-*a* to be replaced, and the process gas is purged to the outside of the vacuum vessel through the process chamber 6 and the exhaust line 15. In this case, the process gas introduction valves 5-1 to 5-*n* and the merged gas introduction valve 13-*b* are opened.

A process of increasing the pressure of the gas in the inner portion of the processing chamber 6 by the inert gas and a process of exhausting the process gas in the process gas supply line through the bypass line 11 and purging the inert gas from the process gas exhaust line through the merged gas supply line 13-*a* and from the processing chamber 6 through the exhaust line 15 may be performed with an order, and a process of opening the inner portion of the processing chamber 6 by increasing the pressure in the processing chamber 6 to the atmospheric pressure and a process of exhausting the process gas in the inner portion of the process gas supply line from each process gas supply line through the bypass line 11 may be performed in parallel. Alternatively, a configuration may be such that only one of the process of exhausting through the bypass line 11 and the process of purging the inert gas from the process gas exhaust line to the exhaust line 15 through the processing chamber 6. After the maintenance and inspection of the plasma processing apparatus 100 including the above-described processes are completed, when a mode is switched to the operation for manufacturing the device and the processing of the sample is restarted in the processing chamber 6, the inert gas shutoff valve 2-0 or each of the process gas shutoff valves 2-1 to 2-*n* is opened, the gas used in the processing is merged at a predetermined flow rate or speed regulated by the flow rate regulator 4-0 or flow rate regulators 4-1 to 4-*n*, and introduced into the processing chamber 6 through the merged gas supply line 13-*a* as a processing gas having a predetermined composition and ratio.

In the present embodiment, a maximum flow rate values which can be adjusted by the respective flow rate regulators 4-1 to 4-*n* in the gas supply line 13 are different in respective source gas supply lines. For example, the flow rate regulator 4-0 in the inert gas supply line 13-0 has a maximum settable flow rate of 20 L/min, while the flow rate regulators 4-1 to 4-*n* in the process gas supply lines 13-1 to 13-*n*, respectively, have maximum settable flow rate values of 20 L/min and 5 L/min.

In such a configuration, it is necessary to supply the gas at a large flow rate instead of requiring a performance to adjust the flow rate required for purging in the processing chamber 6 and each line in the gas supply line 13 and to adjust the flow rate with high accuracy in diluting the gas supplied through these lines, it is necessary to adjust with a small flow rate and higher accuracy in order to process the sample in the processing chamber 6, and it is necessary to use the flow rate regulators separately depending on the purpose.

Figure 2:
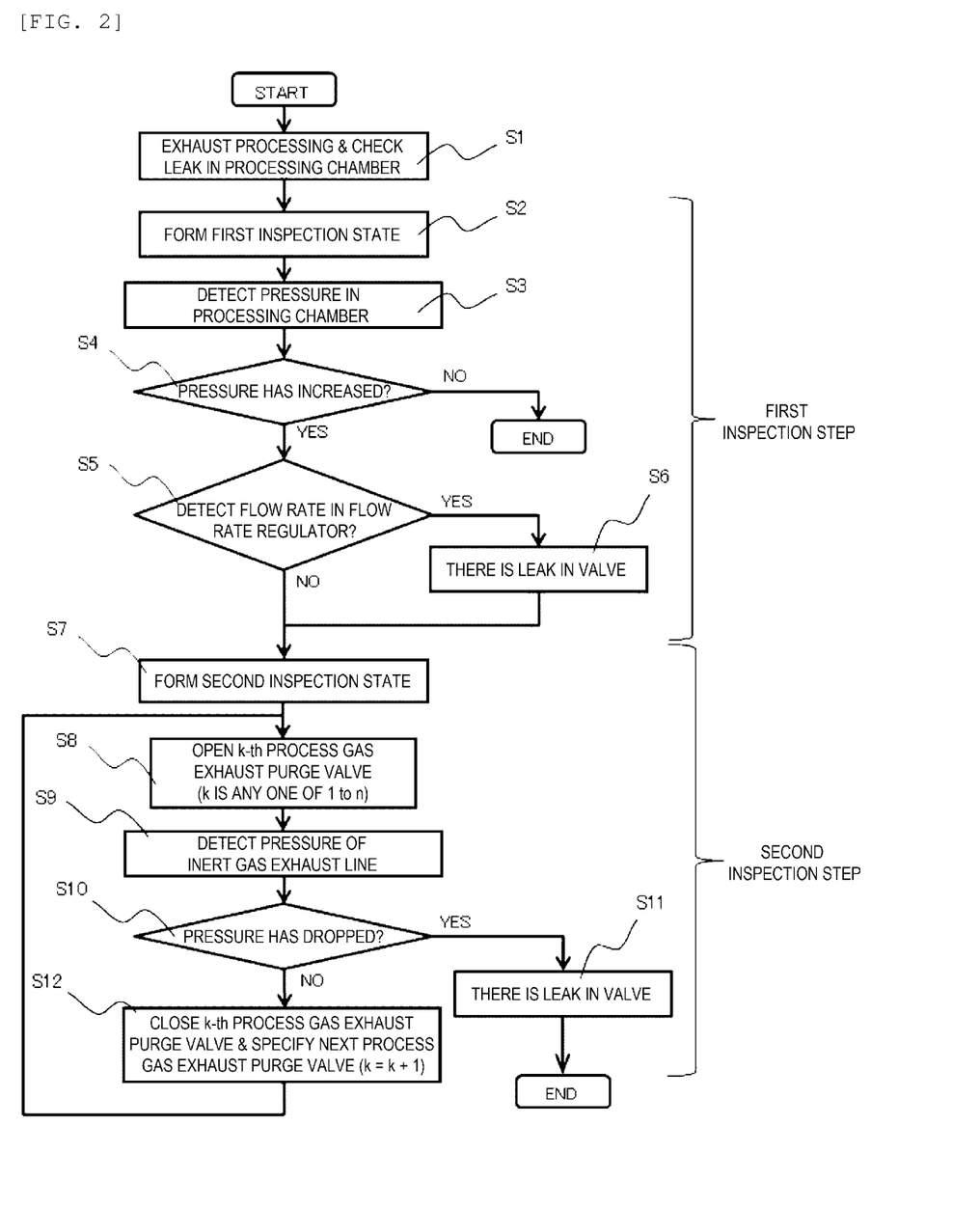
FIG. 2 is a flowchart showing a flow of operations of inspecting leaks in process gas introduction valves using an inert gas in the embodiment shown in FIG. 1.

Operations of inspecting leaks in the first process gas introduction valve 5-1 to the n-th process gas introduction valve 5-*n* in the plasma processing apparatus 100 of the present embodiment configured as described above will be described with reference to FIGS. 2 to 4. FIG. 2 is a flowchart showing a flow of operations of inspecting the leaks in the process gas introduction valves using the inert gas in the embodiment shown in FIG. 1.

As described with reference to FIG. 1, if the control unit 12 detects that the operation of the processing for manufacturing the semiconductor device by the plasma processing apparatus 100 is performed for the predetermined number of samples or the cumulative time, the control unit 12 stops the operation for processing the sample of the plasma processing device to manufacture the semiconductor device based on the software algorithm stored in the storage apparatus, and causes the apparatus to perform the operation (in maintenance mode) for maintenance and inspection of the apparatus. The maintenance and inspection of the gas supply line 13 are performed during such an operation in the maintenance mode.

In a state in which the operation of the maintenance mode is started, first, if the control unit 12 detects a state in which the gas does not flow through any of the source gas lines of the gas supply line 13 by signals from the flow rate regulators 4-0 to 4-*n* on the respective lines, as described above, the process gases remaining in the inner portion of the gas supply line 13 and the inner portion of the processing chamber 6 are exhausted by the exhaust pump 9 through the exhaust line 15. In a state in which the processing chamber 6 is sealed, the inner portion of the processing chamber 6 is depressurized to a vacuum state equal to or higher than that during the processing of the sample to inspect whether there is a leak from the processing chamber 6 (step S1).

Then, in the gas supply line 13, according to an instruction signal from the control unit 12, the first process gas shutoff valve 2-1 to the n-th process gas shutoff valve 2-*n* and the first process gas introduction valve 5-1 to the n-th process gas introduction valve 5-*n* are set to a closed state (closed), and the first process gas exhaust purge valve 3-1 to the n-th process gas exhaust purge valve 3-*n* are set to an open state in the lines. Further, a first inspection state is formed in which all of the first flow rate regulator 4-1 of the first process gas supply line 13-1 to the n-th flow rate regulator 4-*n* of the n-th process gas supply line 13-*n* are set to a fully open state in which the flow rate or the speed of the gas that can be set by the first flow rate regulator 4-1 to the n-th flow rate regulator 4-*n* is set to a predetermined maximum flow rate and a predetermined maximum speed.

By setting the inert gas shutoff valve 2-0 to the open state, setting the flow rate regulator 4-0 of the inert gas supply line to the fully open state, and setting the inert gas exhaust purge valve 3-1 to the open state, the inert gas is supplied from the inert gas supply line 13-0 to each of the process gas supply lines 13-1 to 13-*n* at a high pressure to fill the process gas supply lines 13-1 to 13-*n*. The exhaust regulating valve 8 is set to the closed state, and the merged gas introduction valve 13-*b* is set to the open state (step S2). Thereafter, the first inspection step is performed for a predetermined period.

Figure 3:
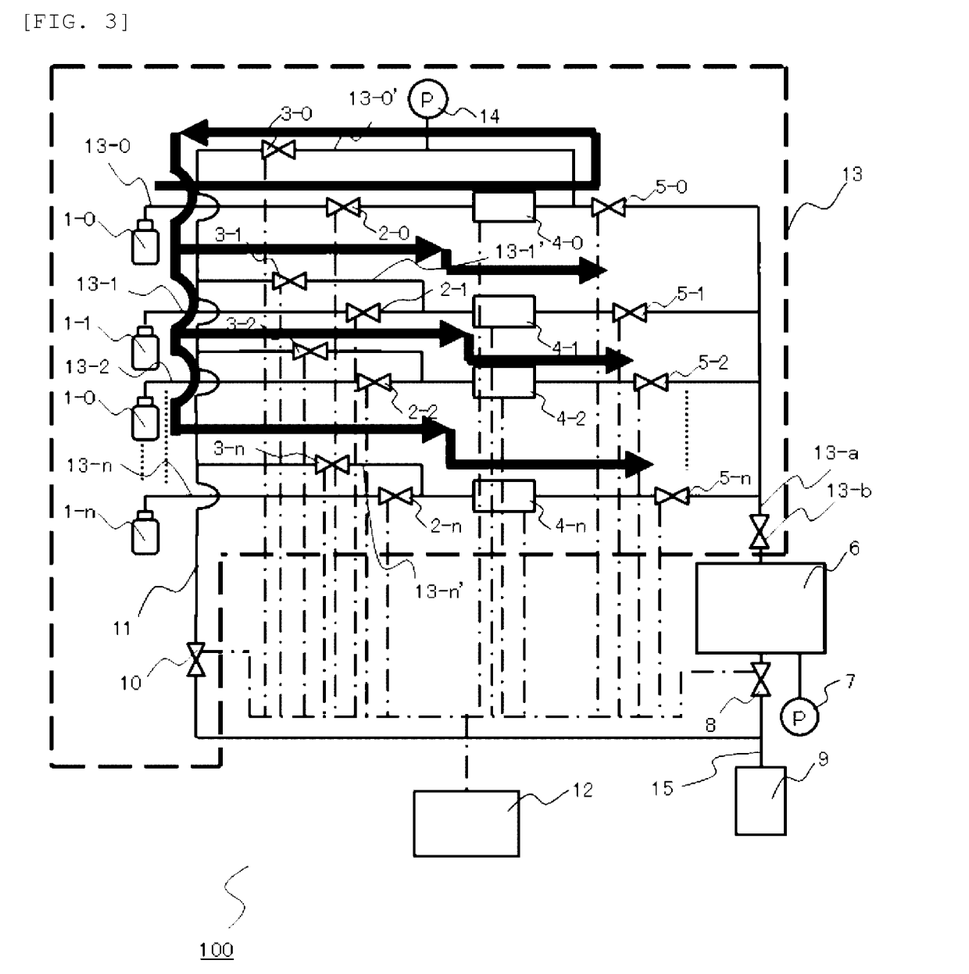
FIG. 3 is a diagram schematically showing a flow of a gas in a gas supply line in a first inspection step shown in FIG. 2.

A flow path of the inert gas in the above-described first inspection state in step S2 will be described with reference to FIG. 3. FIG. 3 is a diagram schematically showing a flow of a gas in the gas supply line in the first inspection step shown in FIG. 2.

That is, the inert gas passes through the inert gas shutoff valve 2-0 and the flow rate regulator 4-0 from the inert gas supply source 1-0 on the inert gas supply line 13-0, enters the inert gas exhaust line 13-0', and enters the bypass line 11 through the inert gas exhaust purge valve 3-0. Further, the inert gas enters the first to n-th process gas exhaust lines 13-1' to 13-*n*' connected to the bypass line 11, and enters each of the process gas supply lines 13-1 to 13-*n* through the first process gas exhaust purge valve 3-1 to the n-th process gas exhaust purge valve 3-*n*. Then, the inert gas passes through the flow rate regulators 4-1 to 4-*n* of the respective process gas supply lines and reaches the first process gas introduction valve 5-1 to the n-th process gas introduction valve 5-*n*.

In the first inspection step, the control unit 12 that receives an output from the pressure gauge 7 that detects the pressure in the processing chamber 6 connected to the vacuum vessel detects a pressure value in the processing chamber 6 and determines whether or not the pressure value is within an allowable range (step S3). That is, in the first inspection state, if the leak occurs in one of the first process gas introduction valve 5-1 to the n-th process gas introduction valve 5-n, the inert gas flows into the processing chamber 6 through the merged gas supply line 13-a to cause a change in the pressure in the processing chamber 6, which is detected by the pressure gauge 7. On the other hand, if no leak occurs in any of the first process gas introduction valve 5-1 to the n-th process gas introduction valve 5-n, the inert gas does not flow into the processing chamber 6, so that the pressure value in the processing chamber 6 does not change.

After the detection of the pressure value in the processing chamber 6 and the change in the pressure value are performed for any time in step S3, the control unit 12 determines whether or not the pressure in the processing chamber 6 is increased (step S4). This is performed by determining whether a change amount between the pressure values detected at specific intervals is within a predetermined allowable range (in this case, a positive magnitude) or outside the predetermined allowable range by the control unit 12. If it is not determined that the pressure is increased (the change amount of the pressure is outside the allowable range), it is determined by the control unit 12 that no leak occurs in any of the first to n-th process gas introduction valves 5-1 to 5-n, and the first inspection step or the inspection of the gas supply line 13 is completed. If it is determined that the pressure is increased, the control unit 12 detects flow rate values of gases from the flow rate regulators 4-1 to 4-n in order to specify which valve of the first process gas introduction valve 5-1 to the n-th process gas introduction valve 5-n has the leak (step S5).

If the flow rate of the gas is detected in at least one of the flow rate regulators 4-1 to 4-n in step S5, the control unit 12 determines that there are one or more leaks in one or more process gas introduction valves of the respective one or more process gas supply lines (step S6). In the first inspection step, it is determined that no leak occurs in a process gas introduction valve that is not determined to have the leak in step S6 among the first to n-th process gas introduction valves 5-1 to 5-n.

Then, after detecting the flow rates of the flow rate regulators 4-1 to 4-n or determining which regulator of these flow rate regulators has the leak in step S5, for a process gas supply line that is not determined to have the leak in the first inspection step, an additional inspection is performed to determine whether or not a minute inert gas that is not reflected in the flow rate value of the flow regulator has the leak.

In FIG. 2, in a state in which the inner portions of the respective process gas supply lines 13-1 to 13-n are filled with the inert gas in the first inspection step, a second inspection state is formed by closing the first process gas exhaust purge valve 3-1 to the n-th process gas exhaust purge valve 3-n and the inert gas shutoff valve 2-0 (step S7). In this state, according to an instruction signal from the control unit 12, one of the first process gas exhaust purge valve 3-1 to the n-th process gas exhaust purge valve 3-n is opened (open state) (step S8), and the second inspection step is performed.

Figure 4:
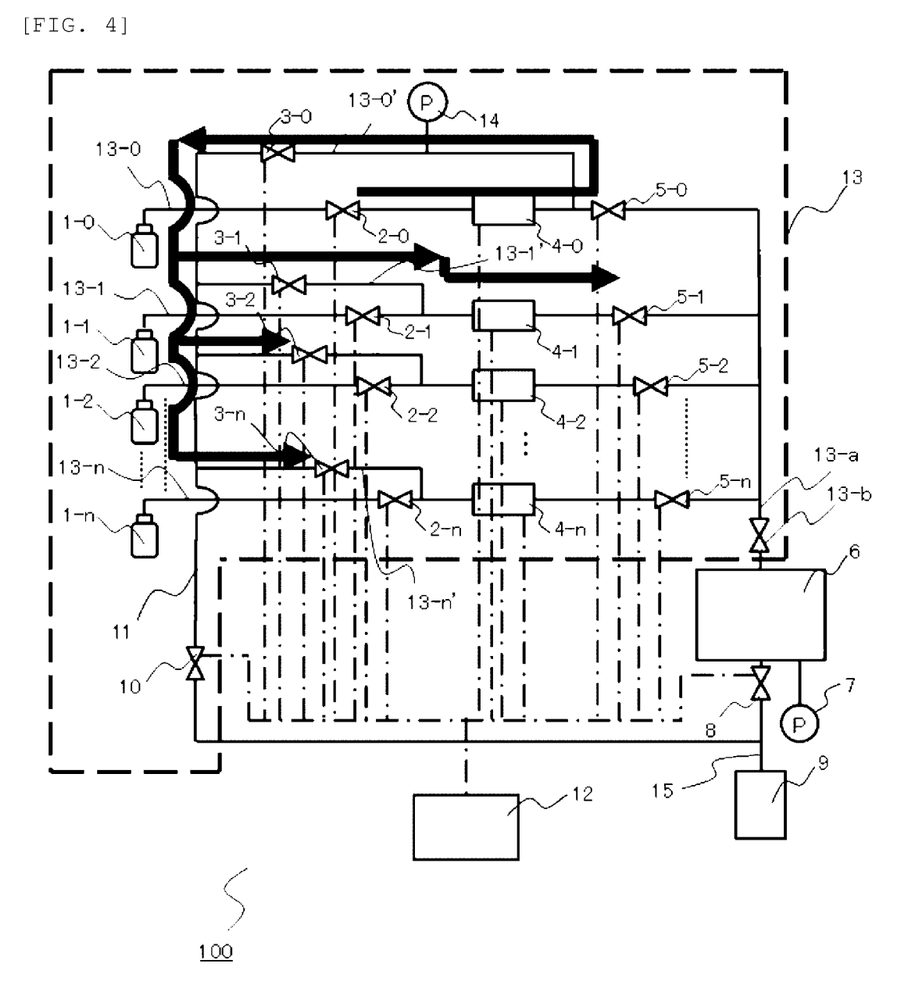
FIG. 4 is a diagram schematically showing a flow of a gas in the gas supply line in a second inspection step shown in FIG. 2.

A flow path of an inert gas in the second inspection step of the above-described step S7 will be described with reference to FIG. 4. FIG. 4 is a diagram schematically showing a flow of a gas in the gas supply line in a second inspection step shown in FIG. 2.

The flow of the inert gas in the second inspection step is shown by thick lines in FIG. 4. That is, following the first inspection step, the inert gas is introduced into the pipes to fill the pipes from the inert gas shutoff valve 2-0 to the first process gas exhaust purge valve 3-1 to the n-th process gas exhaust purge valve 3-n on the respective first to n-th process gas exhaust lines 13-1' to 13-n' through the flow rate regulator 4-0 and the inert gas exhaust purge valve 3-0. A k-th process gas exhaust purge valve (the first process gas exhaust purge valve 3-1 in the example of this figure) of one of the first to n-th process gas exhaust purge valves 3-1 to 3-n is opened, in the corresponding process gas supply line (the first process gas supply line 13-1 in this figure), the inert gas reaches the process gas introduction valve 5-1 and the inner portion of this line is filled with the inert gas.

Then, the control unit 12 receives an output from the pressure gauge 14 disposed on the inert gas exhaust line 13-0' and detects a pressure value of the inert gas exhaust line 13-0' and the change amount of the pressure value (step S9). In step S8, if the leak occurs in the first process gas introduction valve 5-1 of the process gas supply line 13-1 in which the first process gas exhaust purge valve 3-1 is opened, the inert gas flows from the first process gas introduction valve 5-1 into the merged gas supply line 13-a or the processing chamber 6 communicating with the merged gas supply line 13-a, and the inner portion of the first process gas supply line 13-1 is pressurized to generate a pressure drop from a high value state. If no leak occurs in the process gas introduction valve 5-1 of the first process gas supply line 13-1 in which the first process gas exhaust purge valve 3-1 is opened, the pressure drop does not change in the inner portion of the process gas supply line 13-1 in a state in which the inert gas is filled in the process gas supply line 13-1.

When the flow rate regulators 4-1 to 4-n are pressure type flow rate regulators equipped with the pressure gauges in the inner portions, the control unit 12 may be configured to receive the outputs from the pressure gauges provided in these flow rate regulators to detect the pressure values and the changes of the pressure values. In this case, the pressure gauge 14 may not be disposed. In the second inspection step, the merged gas introduction valve 13-b is maintained in the open state.

After the process of detecting the pressure and the change in the pressure in step S9 is performed for a predetermined time as long as these detections can be performed with sufficient accuracy, the control unit 12 determines whether the change amount in the pressure detected is within or outside the predetermined allowable range (in this case, a negative range) (step S10). If it is determined that the pressure drop is outside of the allowable range (the pressure drop is detected), the control unit 12 determines that the leak occurs in the process gas introduction valve of the process gas supply line, and the second inspection step or the inspection of the gas supply line 13 is completed (step S11).

If no pressure drop is detected, the control unit 12 closes the process gas exhaust purge valve 3-1 and specifies a next process gas introduction valve to be inspected (step S12). In the example of FIG. 2, k-th+1=the second process gas introduction valve 5-2) is specified. Thereafter, returning to step S8, according to an instruction signal from the control unit 12, the second process gas exhaust purge valve 3-2 of the second process gas exhaust line 13-2' connected to the process gas supply line 13-2 is opened, and hereinafter, steps S8 to S12 for detecting or determining the presence or absence of the leak in each of the first to n-th process gas introduction valves 5-1 to 5-*n* are repeated.

According to the above-described embodiment, it is possible to inspect the presence or absence of the leak of the valve on each of the source gas line configuring the gas supply line 13 in a short time or with high accuracy, and a period of operation in the maintenance mode in which the semiconductor device is not manufactured is shortened, thereby improving an operation rate of the plasma processing apparatus 100 and improving an efficiency of manufacturing the semiconductor device.

REFERENCE SIGN LIST 1-0 inert gas supply source
1-1 first process gas supply source
1-2 second process gas supply source
1-*n* n-th process gas supply source
2-0 inert gas shutoff valve
2-1 first process gas shutoff valve
2-2 second process gas shutoff valve
2-*n* n-th process gas shutoff valve
3-0 inert gas exhaust purge valve
3-1 first process gas exhaust purge valve
3-2 second process gas exhaust purge valve
3-*n* n-th process gas exhaust purge valve
4-0 flow rate regulator
4-1 flow rate regulator
4-2 flow rate regulator
4-*n* flow rate regulator
5-0 inert gas introduction valve
5-1 first process gas introduction valve
5-2 second process gas introduction valve
5-*n* n-th process gas introduction valve
6 processing chamber
7 pressure gauge
8 exhaust regulating valve
9 exhaust pump
10 exhaust valve
11 bypass line
12 control unit
13 gas supply line
13-0 inert gas supply line
13-0' inert gas exhaust line
13-1 first process gas supply line
13-1' first process gas exhaust line
13-2 second process gas supply source
13-2' second process gas exhaust line
13-*n* n-th process gas supply line
13-*n*' n-th process gas exhaust line
13-*a* merged gas supply line
13-*b* merged gas introduction valve
14 pressure gauge
100 plasma processing apparatus

The invention claimed is:

1. An inspection method for a plasma processing apparatus,
the plasma processing apparatus including:
a processing chamber in which a wafer is processed using a plasma that is formed by supply, into a processing chamber disposed in an inner portion of a vacuum vessel, a processing gas obtained by mixing a plurality of types of gases; and a processing gas supply path that has a plurality of source gas supply paths in which the plurality of types of gases flow in respective inner portions thereof and are supplied, and a merging path in which the plurality of source gas supply paths merge together as one flow path between the plurality of source gas supply paths and the processing chamber, wherein
each of the plurality of source gas supply paths includes: a first valve configured to open and close the source gas supply path; a second valve disposed on an upstream side of the first valve; a flow rate regulator disposed between the first valve and the second valve and configured to regulate a flow rate of the source gas flowing in the inner portion of the source gas supply path; and a connection unit between the source gas supply path and an inert gas supply path in which an inert gas is supplied to the inner portion connected at a position between the second valve and the flow rate regulator,
the inspection method for a plasma processing apparatus comprising:
a first inspection step of, for each of the plurality of source gas supply paths, sequentially determining presence or absence of a leakage in the first valve on the source gas supply path using a flow rate of the inert gas passing through the flow rate regulator on the source gas supply path in a state in which the first valve is closed in each of the plurality of source gas supplying paths and the inert gas is supplied from the inert gas supplying path; and
a second inspection step of, for each of the plurality of source gas supply paths, supplying the inert gas from the inert gas supply path connected to the source gas supplying path in a state in which the first and second valves are closed and detecting the leakage of the first valve on the source gas supply path using a change amount of a pressure of the inert gas supplied to the inert gas supply path if it is not determined in the first inspection step that there is a leakage in the first valve.

2. The inspection method for a plasma processing apparatus according to claim 1, wherein
in the second inspection step, the second inspection step is performed until the leakage is detected in at least one source gas supply path among the plurality of source gas supply paths.

3. The inspection method for a plasma processing apparatus according to claim 1, wherein
a plurality of the flow rate regulators on the plurality of source gas supply paths have different adjustable maximum flow rates.

4. The inspection method for a plasma processing apparatus according to claim 1, wherein
the plasma processing apparatus includes a bypass flow path which is connected to a plurality of the inert gas supply paths connected to the plurality of source gas supply paths, and is coupled to an exhaust pump configured to exhaust a gas in the inner portion of each of the source gas supply paths.

5. The inspection method for a plasma processing apparatus according to claim 4, wherein
the first inspection step is performed after the gas in the inner portion of each of the source gas supply paths is exhausted through the bypass flow path using the exhaust pump.

* * * * *